United States Patent [19]

Nicollini et al.

[11] Patent Number: 4,609,877
[45] Date of Patent: Sep. 2, 1986

[54] BUFFER CIRCUIT WITH DIFFERENTIAL STRUCTURE FOR MEASUREMENT OF CAPACITIVE CHARGES

[75] Inventors: Germano Nicollini, Piacenza, Italy; Daniel Senderowicz, Berkeley, Calif.; Pierangelo Confalonieri, Canonica d'Adda, Italy

[73] Assignee: SGS Microelettronica S.p.A., Catania, Italy

[21] Appl. No.: 795,834

[22] Filed: Nov. 7, 1985

[30] Foreign Application Priority Data

Nov. 12, 1984 [IT] Italy .............................. 23531 A/84

[51] Int. Cl.[4] .............................................. H03F 3/45
[52] U.S. Cl. ........................................ 330/9; 330/51; 330/69; 328/151

[58] Field of Search ................. 330/51, 84, 9, 69, 252; 307/353; 328/151

[56] References Cited

U.S. PATENT DOCUMENTS 4,190,805  2/1980  Bingham .................................. 330/9

Primary Examiner—James B. Mullins
Attorney, Agent, or Firm—Cushman, Darby & Cushman

[57] ABSTRACT

In a buffer with an operational amplifier having two inputs and two outputs and two feedback capacitances are inserted two other capacitances which in the measurement stage are switched in parallel to the feedback ones with opposite sign in such a manner as to cancel out the effects on the output voltage signal.

3 Claims, 1 Drawing Figure

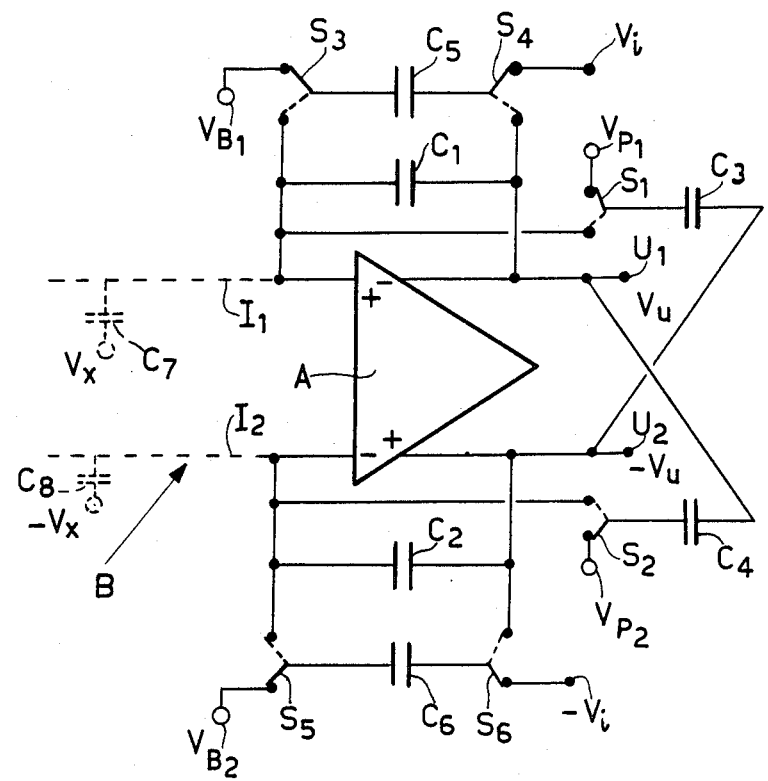

BUFFER CIRCUIT WITH DIFFERENTIAL STRUCTURE FOR MEASUREMENT OF CAPACITIVE CHARGES

BACKGROUND OF THE INVENTION

The present invention relates to a buffer circuit with differential structure for the measurement of capacitive charges.

In many electronic systems it is required to convert a capacitive charge into a corresponding voltage signal through a low-impedance circuit, usually called "buffer".

"Single-ended", i.e. nondifferential, circuits are known which perform said function but they tend to be affected by disturbances in the power supply and consequently to give quite imprecise and unsteady output signals.

Also known are reversed differential circuits which however require zeroing or resetting between one operation and the next. This complicates both the structure and the operation of said circuits.

SUMMARY OF THE INVENTION

The object of the present invention is to achieve a buffer circuit with differential structure which in a structurally and functionally simple manner would allow conversion of a capacitive charge into a steady, precise signal free of every kind of disturbance.

In accordance with the invention said object is achieved by means of a buffer circuit comprising an operational amplifier with two inputs, two outputs and a pair of feedback capacitances between said outputs and the corresponding inputs characterized in that it includes another pair of capacitances the same as said feedback capacitances and commutating devices for connecting alternately each of said other capacitances between a respective amplifier output and a polarization potential or between said amplifier output and the input corresponding to the other output.

BRIEF DESCRIPTION OF THE DRAWING

An example of a practical embodiment of the buffer circuit according to the invention is illustrated for greater clarity in the only FIGURE given in the annexed drawing which shows the circuit diagram thereof.

DESCRIPTION OF THE PREFERRED EMBODIMENT

In the drawing, B indicates a buffer circuit including an operational amplifier A equipped with two reversed inputs $I_1$ and $I_2$ and two outputs $U_1$ and $U_2$ as well as feedback capacitances (the same) $C_1$ and $C_2$ connecting the outputs $U_1$ and $U_2$ with their repective inputs $I_1$ and $I_2$.

The output $U_1$ may be connected to an input polarization potential $V_{P2}$, e.g. to earth, or alternatively to the input $I_2$ by means of a capacitance $C_4$ as a function of the state of a commutator $S_2$ while the output $U_2$ may be alternatively connected to an input polarization potential $V_{P1}$ (the same as $V_{P2}$) or to the input $I_1$ by means of a capacitance $C_3$ (the same as $C_2$) as a function of the state of a commutator $S_1$ synchronized with $S_2$ or integral with same.

To employ a buffer circuit for the measurement of a capacitive charge such as the one stored in a capacitor $C_5$ and identical capacitor $C_6$ after the passage of a current between an input with potential $V_i$ and respectively $-V_i$ and a terminal with potential $V_{B1}=V_{B2}=V_{P1}=V_{P2}$, two more pairs of switches $S_3$, $S_4$ and $S_5$, $S_6$ are provided and synchronized with $S_1$, $S_2$ or are integral with it.

In a first stage of operation all the switches $S_1$–$S_6$ are in the position illustrated in a continuous row in the drawing and consequently the capacitors $C_5$ and $C_6$ are charged at voltage $V_i$ and $-V_i$ respectively while the capacitors $C_1$ and $C_2$ together with $C_3$ and $C_4$ hold steady the output voltage $V_u$ and $-V_u$ previously formed at the terminals $U_1$ and $U_2$.

In a second stage of operation all the switches $S_1$–$S_6$ are moved to the position illustrated in dot and dash lines so that the capacitors $C_5$ and $C_6$, which are now charged at potentials $V_i$ and $-V_i$, are connected to the buffer circuit B and the capacitors $C_4$ and $C_3$ inject an equal charge of opposite sign to the one accumulated into capacitors $C_2$ and $C_1$. The result is that voltage signals $V_u$, $\times V_u$ are stabilized at the outputs $U_1$ and $U_2$, which reflect the charge of the capacitors $C_5$, $C_6$, i.e. they are the same as $V_i$, $-V_i$.

The precision of the output signals is also ensured by the capacitors $C_3$ and $C_4$ which, by injecting an equal charge of opposite sign to the one accumulated in the capacitors $C_1$ and $C_2$, cancels out their effects and in particular the phenomenon of division of the charge compared with $C_5$ and $C_6$ due to the presence of $C_1$ and $C_2$ and to the voltage memorized by them previously, which otherwise would tend to give an output signal not corresponding to the charge of the capacitor being measured. In this case the capacitor $C_5$, $C_6$ is connected to the operational amplifier A without any other comparison capacitance so that the output signal is steady, precise and unaffected by the previous operation condition.

It should also be noted that cancellation of the capacitances $C_1$ and $C_2$ by $C_3$ and $C_4$ allows in the second aforementioned stage connection to the positive input $I_1$ of one or more capacitors $C_7$ and to the negative input $I_2$ one or more capacitors $C_8$ connected to their respective generators $V_x$ and $-V_x$ each time it is desired to amplify these signals by a certain factor $K = -C_7/C_1 (C_7 = C_8)$.

This circuit therefore operates simultaneously as a buffer for certain signals and as an amplifier for other signals regardless of their number.

We claim:

1. Buffer circuit with differential structure for measurement of capacitive charges comprising an operational amplifier with two inputs, two outputs and a pair of feedback capacitances between said outputs and the corresponding inputs characterized in that it comprises another pair of capacitances the same as said feedback capacitances and commutating devices for connecting alternatively each of said other capacitances between a respective output of the amplifier and a polarization potential or between said amplifier output and the input corresponding to the other output.

2. Buffer circuit according to claim 1 characterized in that it comprises other commutating devices synchronized with the abovementioned ones for connection of a capacitance being measured in parallel with said feedback capacitance simultaneously with connection of said other capacitances between said amplifier output and the input corresponding to the other output.

3. Buffer circuit according to claim 1 characterized in that said polarization potential is equal to the amplifier input polarization potential.

* * * * *